United States Patent [19]

Ortyn

[11] Patent Number: 5,504,350
[45] Date of Patent: Apr. 2, 1996

[54] LENS CONFIGURATION

[75] Inventor: William E. Ortyn, Duvall, Wash.

[73] Assignee: Spectra-Physics Scanning Systems, Inc., Eugene, Oreg.

[21] Appl. No.: 380,205

[22] Filed: Jan. 30, 1995

Related U.S. Application Data

[63] Continuation of Ser. No. 928,916, Aug. 12, 1992, abandoned.

[51] Int. Cl.$^6$ .................................................. H01L 33/00
[52] U.S. Cl. .................... 257/81; 257/82; 257/98; 257/99; 372/50; 372/101; 235/462; 235/472; 359/650; 359/740
[58] Field of Search .................. 257/98, 99, 81, 257/82; 372/101, 50; 235/462, 467, 472, 454, 470; 359/648, 649, 650, 651, 720, 738, 739, 740

[56] References Cited

U.S. PATENT DOCUMENTS

| | | | |
|---|---|---|---|
| 3,974,507 | 8/1976 | Chemelli et al. | 372/101 X |
| 4,168,660 | 3/1989 | Swartz et al. | 235/472 |
| 4,185,891 | 1/1980 | Kaestner | 372/101 X |
| 4,203,652 | 5/1980 | Hanada | 372/101 X |
| 4,415,238 | 11/1983 | Braat et al. | 350/432 |
| 4,756,972 | 7/1988 | Kloosterboer et al. | 428/417 |
| 4,991,183 | 2/1991 | Meyers | 372/101 X |
| 5,015,831 | 5/1991 | Eastman et al. | 235/462 |
| 5,021,641 | 6/1991 | Swartz et al. | 235/462 |
| 5,080,706 | 1/1992 | Snyder et al. | 65/102 |
| 5,081,343 | 1/1992 | Chadima, Jr. et al. | 235/462 X |
| 5,081,639 | 1/1992 | Snyder | 372/101 |
| 5,233,170 | 8/1993 | Metlitsky et al. | 235/472 X |
| 5,296,724 | 3/1994 | Ogata et al. | 257/99 X |

FOREIGN PATENT DOCUMENTS

| | | | |
|---|---|---|---|
| 62-108584 | 5/1987 | Japan | 257/98 |
| 62-235787 | 10/1987 | Japan | 257/98 |
| 63-189981 | 8/1988 | Japan . | |
| 1619363 | 1/1991 | U.S.S.R. | 372/101 |

OTHER PUBLICATIONS

Kortz et al., "Stability and Beam Divergence of Multimode Lasers with Internal Variable Lenses,"]*Applied Optics*, vol. 20, No. 23, 1 Dec. 1981, pp. 4124–4134.

*Primary Examiner*—William Mintel
*Attorney, Agent, or Firm*—Lyon & Lyon

[57] ABSTRACT

A lens configuration integral with the output window of an enclosure at least partly surrounding a source of a beam is provided. In one embodiment, the beam is an anomorphic diverging beam, such as that produced by a diode laser, having differing angles of divergence along parallel and perpendicular axes, and the at least one lens is configured to at least partly equalize the angles of divergence along the perpendicular and parallel axes.

41 Claims, 9 Drawing Sheets

| ELEMENT | 1ST RADIUS | 2ND RADIUS | INDEX | THICKNESS | AIR SPACE | SINGLET | | | SYSTEM | | |
|---|---|---|---|---|---|---|---|---|---|---|---|
| | | | | | | FOCUS | P1 | P2 | FOCUS | P1 | P2 |
| Pos Cylinder | 0.490 | Infinite | 1.48959 | 0.030 | — | 1.001 | 0 | 0.020 | 1.001 | 0 | 0.010 |
| Cover Glass | Infinite | Infinite | 1.51391 | 0.500 | 0 | Infinite | Infinite | Infinite | 1.001 | 0 | 0.350 |
| Neg. Cylinder | Infinite | 0.735 | 1.48959 | 0.005 | 0 | -1.501 | 0.003 | 0 | 1.759 | 1.759 | 0.622 |

The conventions for this base prescription are as follows:

(INPUT)
1. Radii — curvature is positive if center is to the right of vertex.
2. Index — always positive; system is assumed to be immersed in air of index 1.00000.
3. Thickness — distance on axis from vertex to vertex in the media.
4. Air space — distance between singlets; air space between singlet on current line and singlet on previous line.

(OUTPUT)
1. Singlet — data for singlet lens on current line.
2. Singlet P1 — first principal plane location; measured positive if to right of vertex.
3. Singlet P2 — second principal plane location; measured positive if to left of vertex.
4. System — data for the entire system through the current element.
5. System Focus — focal length for the entire system through the current element.
6. System P1 — first principal plane location for the entire system measured positive to the right of the first vertex of the system.
7. System P2 — second principal plane location for the system measured positive to the left of the last vertex listed.

| ELEMENT | 1ST RADIUS | 2ND RADIUS | INDEX | THICKNESS | AIR SPACE | SINGLET | | | SYSTEM | | |
|---|---|---|---|---|---|---|---|---|---|---|---|
| | | | | | | FOCUS | P1 | P2 | FOCUS | P1 | P2 |
| Pos Cylinder | 0.367 | Infinite | 1.48959 | 0.030 | — | 0.750 | 0 | 0.020 | 0.750 | 0 | 0.020 |
| Cover Glass | Infinite | Infinite | 1.51391 | 0.400 | 0 | Infinite | Infinite | Infinite | 0.750 | 0 | 0.284 |
| Neg. Cylinder | Infinite | 0.461 | 1.48959 | 0.005 | 0 | -0.941 | 0.003 | 0 | 1.473 | 0.451 | 0.565 |

FIG. 7

| ELEMENT | 1ST RADIUS | 2ND RADIUS | INDEX | THICKNESS | AIR SPACE | SINGLET | | | SYSTEM | | |
|---|---|---|---|---|---|---|---|---|---|---|---|
| | | | | | | FOCUS | P1 | P2 | FOCUS | P1 | P2 |
| Pos Cylinder | 0.490 | Infinite | 1.48959 | 0.030 | — | 1.001 | 0 | 0.020 | 1.001 | 0 | 0.020 |
| Cover Glass | Infinite | Infinite | 1.51391 | 0.400 | 0 | Infinite | Infinite | Infinite | 1.001 | 0 | 0.284 |
| Neg. Cylinder | Infinite | 0.730 | 1.48959 | 0.005 | 0 | -1.491 | 0.003 | 0 | 1.918 | -0.370 | 0.551 |

TABLE I

| EXAMPLE | DIVERGENCE | ASTIGMATISM OF VLD | ASTIGMATIC CORRECTION |
|---|---|---|---|
| First Baseline Example | 7 x 33 FWHM | 35 microns | Yes |
| First Example | 7 x 33 FWHM | 0 | No |
| Second Example | 7 x 33 FWHM | 0 | No |
| Second Baseline Example | 7 x 33 FWHM | 40 microns | No |
| Third Example | 7 x 33 FWHM | 40 microns | Yes |
| Fourth Example | 7 x 33 FWHM | 40 microns | Yes |

FIG. 8

TABLE II
(All Distances in mm)

| ELEMENTS | FIRST EXAMPLE | | | SECOND EXAMPLE | | | THIRD EXAMPLE | | | FOURTH EXAMPLE | | |
|---|---|---|---|---|---|---|---|---|---|---|---|---|
| | Distance From Previous Element | Focal Length Par. | Focal Length Perp. | Distance From Previous Element | Focal Length Par. | Focal Length Perp. | Distance From Previous Element | Focal Length Par. | Focal Length Perp. | Distance From Previous Element | Focal Length Par. | Focal Length Perp. |
| Positive Cyl. | 1.0/1.0 | Infinite | 0.750 | 1.0/1.0 | Infinite | 1.0 | 1.040/1.0 | Infinite | 0.750 | 1.040/1.0 | Infinite | 1.0 |
| Negative Cyl. | 0.5 | Infinite | -0.938 | 0.5 | Infinite | -1.5 | 0.450 | Infinite | -0.941 | 0.450 | Infinite | -1.491 |
| Collimating Lens | 8.525 | 10.025 | 10.025 | 8.525 | 10.025 | 10.025 | 8.510 | 10.000 | 10.000 | 8.510 | 10.000 | 10.000 |
| Focusing Lens | 345 | 420 | 420 | 345 | 420 | 420 | 345 | 420 | 420 | 345 | 420 | 420 |

FIG. 9

TABLE III
(All Distances in mm)

| EXAMPLE | OPTICAL EFFICIENCY | LOCATION OF BEAM WAIST | | SIZE OF BEAM WAIST | | ASTIGMATISM IN SCAN PLANE |
|---|---|---|---|---|---|---|
| | | PAR. | PERP. | PAR. | PERP. | |
| First Baseline Example | 38.4% | 418.337 | 418.405 | 0.224 | 0.221 | 0.1 |
| First Example | 62.2% | 418.33 | 417.205 | 0.224 | 0.219 | 1.1 |
| Second Example | 54.2% | 418.33 | 419.280 | 0.224 | 0.219 | 1.0 |
| Second Baseline Example | 38.2% | 350.106 | 418.405 | 0.222 | 0.221 | 68. |
| Third Example | 60.4% | 418.376 | 417.028 | 0.222 | 0.222 | 1.3 |
| Fourth Example | 53.6% | 418.376 | 417.459 | 0.222 | 0.222 | 0.9 |

FIG. 10

LENS CONFIGURATION

This is a continuation of application Ser. No. 07/928,916 filed on Aug. 12, 1992, now abandoned.

BACKGROUND OF THE INVENTION

1. Field of the Invention

This invention relates generally to a lens configuration, and more specifically, to a lens configuration which is integral with the output window of an enclosure at least partially surrounding a source of a beam.

2. Background Information

The output beam of a laser diode is characterized by the fact that the divergence of the beam in a direction perpendicular to the active layer is typically much greater than that in a direction parallel to the active layer. With reference to FIG. 1, the cross-section 3 of the beam emitted from the active layer 2 of laser diode 1 is illustrated after the beam has travelled a certain distance from the laser diode. As seen, the angle of divergence along an axis 4 which is perpendicular to the active layer, $\Theta_\perp$, is greater than the angle of divergence along an axis 5 which is parallel to the active layer, $\Theta_\|$. The ratio of the angle of divergence along the perpendicular direction, $\Theta_\perp$, to that along the parallel direction, $\Theta_\|$, is typically between 3:1 and 5:1. In many applications, such as bar code scanning, which utilize laser diodes, it is desirable to at least partially equalize the angles of divergence along the parallel and perpendicular directions, such that the beam, in cross-section, achieves a more circular shape, the advantage being increased flexibility with respect to scanning the beam over a bar code symbol.

Another characteristic of the output beam of a laser diode is astigmatism, according to which the apparent source of the beam, when measured from a direction perpendicular to the active layer, differs from that when measured from a direction parallel to the active layer. With reference to FIG. 2, in which compared with FIG. 1, like elements are referenced with like identifying numerals, the apparent source of the rays along the perpendicular axis 4, identified with reference numeral 6 in the figure, is different from the apparent source of the rays along the parallel axis 5, identified with reference numeral 7. The fact that there is a spacing between these sources, identified with numeral 8 in the figure, is what is known as astigmatism. Again, in the applications such as bar code scanning mentioned above, it is desirable to at least partially eliminate the astigmatism in the beam, the advantage being that the beam waist, when measured along the parallel and perpendicular directions, will occur at about the same location along the optical path of the beam, again providing greater flexibility in scanning the beam over a bar code symbol.

Prior art attempts to at least partially equalize the angles of divergence along the parallel and perpendicular directions have involved the use of aperaturing, the use of an external anomorphic prism pair, or the use of a micro-lens, the latter as described in U.S. Pat. Nos. 5,080,706 and 5,081,639. Each of these approaches, however, is fraught with one or more drawbacks. As to aperaturing, this approach is characterized by low optical efficiency. As to the use of an anomorphic prism pair, this approach is costly and results in a significant increase in the size of a system. As to the use of a micro-lens, this approach requires extremely tight tolerances in the manufacturing process, and is therefore costly.

Accordingly, it is an object of the present invention to provide a lens configuration which achieves greater optical efficiency and reduced cost and size compared to prior art methods. Additional objects and advantages of the invention will be set forth in the description which follows or may be learned by practice of the invention.

SUMMARY OF THE INVENTION

To achieve the foregoing objects, and in accordance with the purpose of the invention as embodied and broadly described herein, there is provided an optical system comprising an enclosure including a window; a source of a beam at least partially surrounded by the enclosure; means for directing the beam along an optical path through the window; and at least one lens integral with the window. In one embodiment, the at least one lens is made integral with the window through a lamination process. In a second embodiment, the beam is an anomorphic diverging beam such as that produced by a diode laser, and the at least one lens is configured to at least partially equalize the angles of divergence along the axes of the beam. In other embodiments, the at least one lens is alternatively or additionally configured to substantially correct the beam for astigmatism, substantially collimate the beam, or focus the beam.

BRIEF DESCRIPTION OF THE DRAWINGS

FIGS. 5–7 are base prescriptions for the laminates of the subject invention; and FIGS. 8–10 are tables summarizing parameters associated with examples of the subject invention.

DESCRIPTION OF THE PREFERRED EMBODIMENTS

In a preferred embodiment of the subject invention, at least one lens is provided which is made integral with a window in an enclosure at least partially surrounding a source of a beam which is directed along an optical path through the window.

In the case where the beam is an anomorphic diverging beam (differing angles of divergence along different axes of the beam) such as that produced by a laser diode, the at least one lens is advantageously configured to at least partially equalize the angles of divergence along the axes of the beam.

In the case where the beam is astigmatic (differing apparent sources when measured from different axes of the beam), as is typically the case for a beam produced by a laser diode, the at least one lens is advantageously configured to at least partially correct for astigmatism.

In the case where the beam is diverging (and not necessarily anomorphic), the at least one lens is advantageously configured to at least partially collimate the beam.

In the case where the beam is not converging, the at least one lens is advantageously configured to focus the beam.

Figure 1:
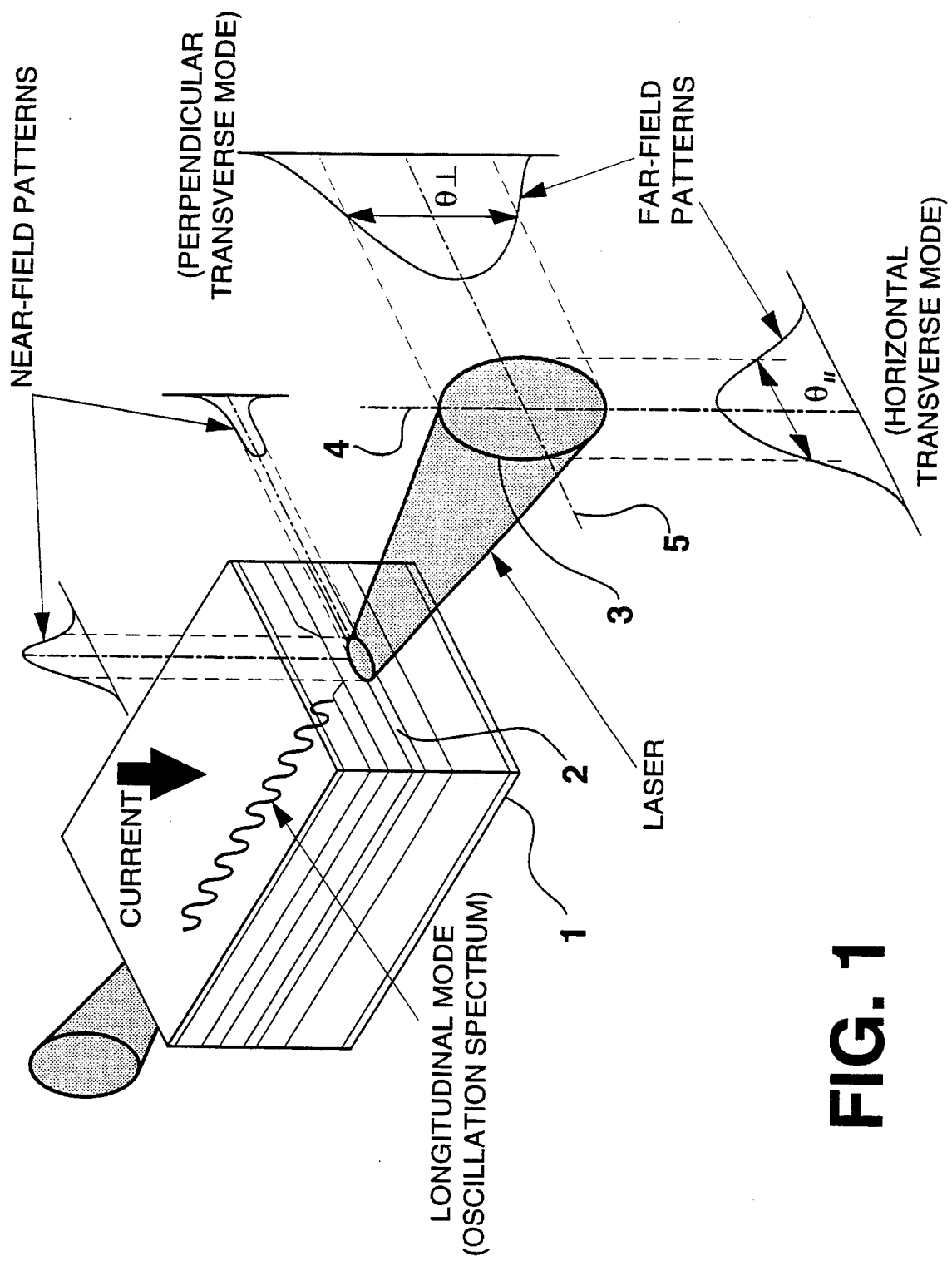
FIG. 1 is an illustration of the divergence characteristics of a diode laser beam.
Figure 2:
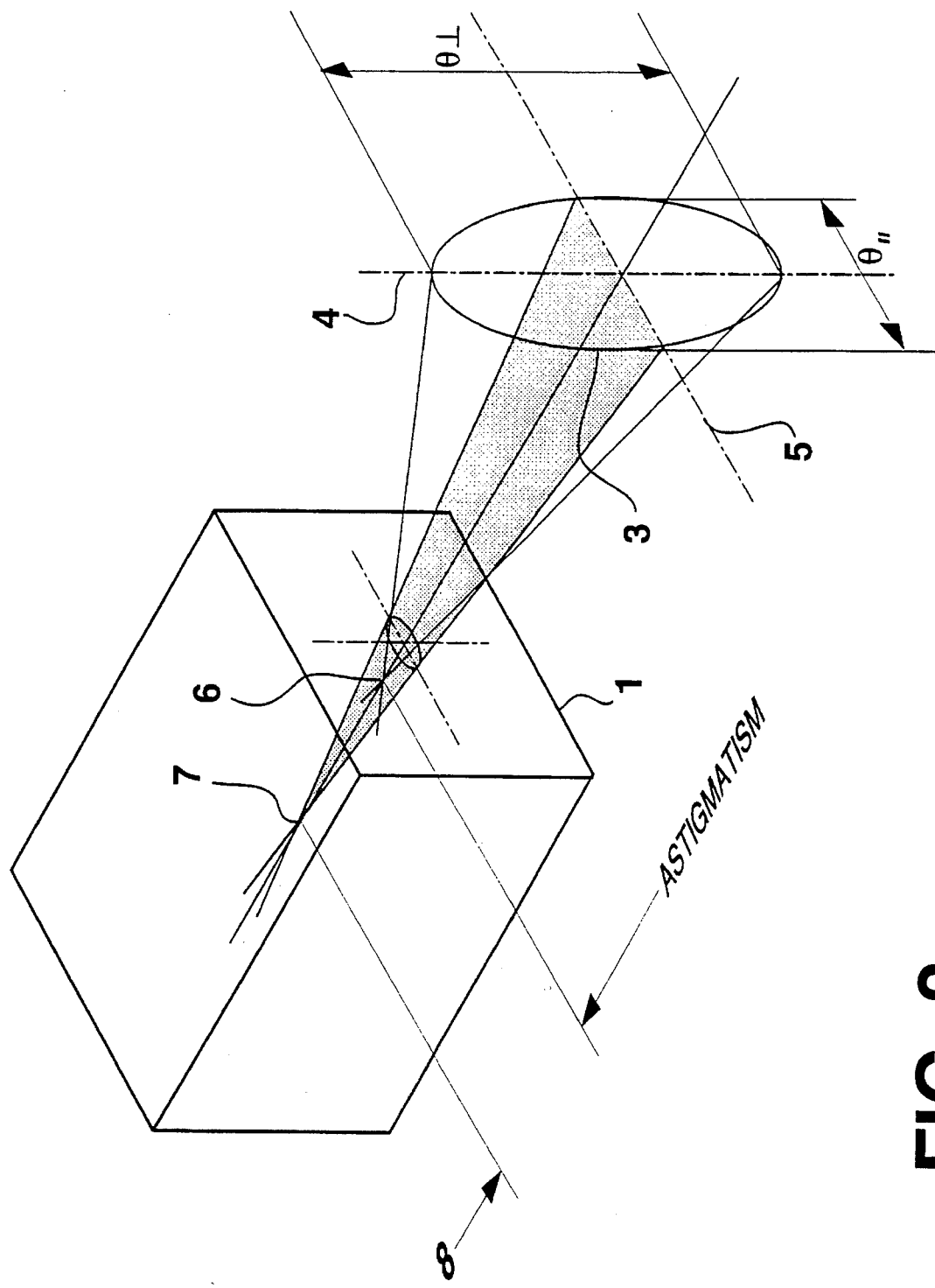
FIG. 2 is an illustration of astigmatism in a diode laser beam.
Figure 3:
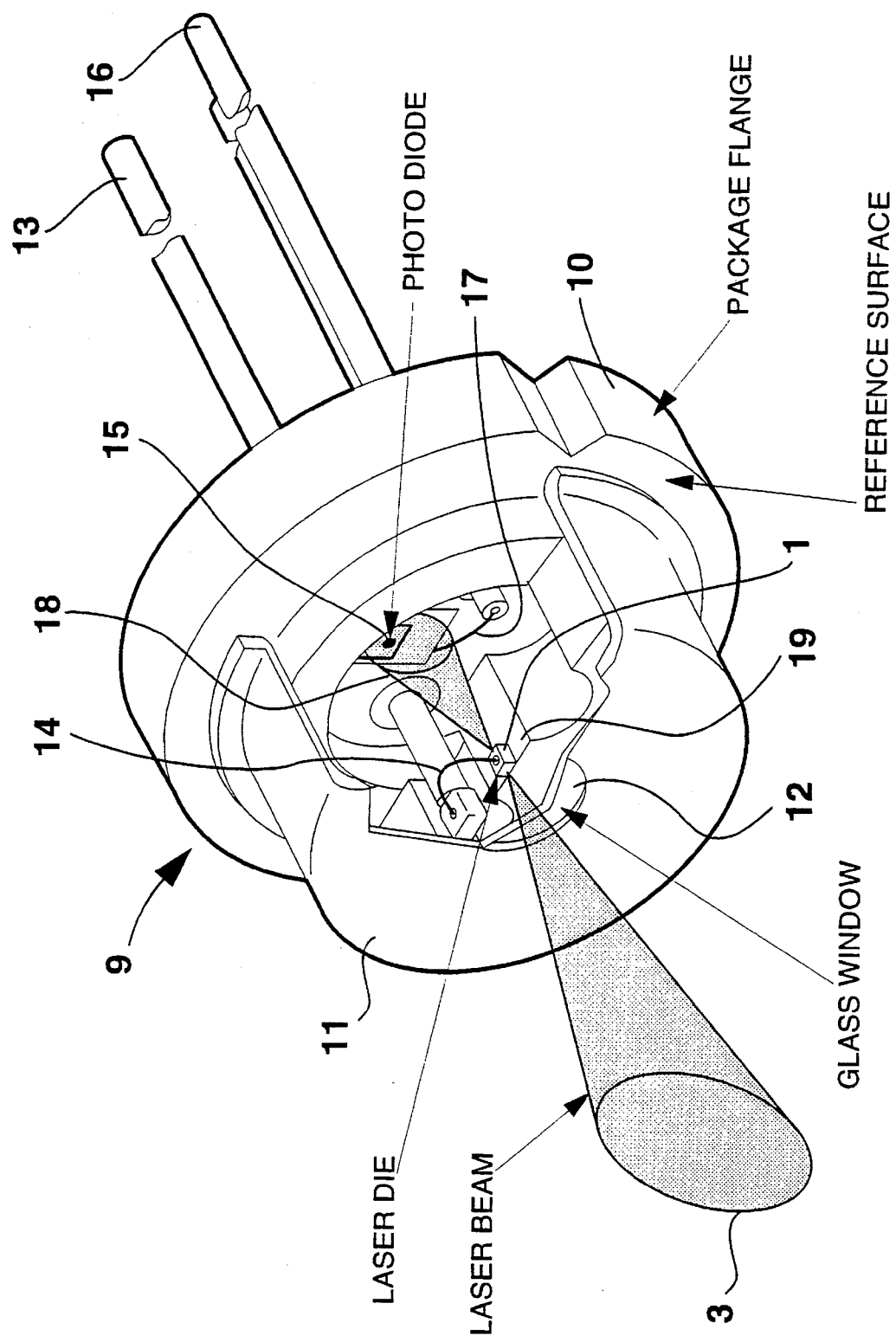
FIG. 3 is an illustration of a typical laser diode package.

Turning to the case where the beam is produced by a laser diode, the structure of a typical laser diode package is illustrated in FIG. 3, in which, compared with earlier figures, like elements are referenced with like reference numerals. As shown, the package includes package flange 10, with laser diode 1 mounted at about the center of the flange on heat sink 19. Also provided is lead 13, which is coupled to the laser diode by means of filament 14. When in use, a driving current is provided to lead 13, which causes the laser diode to emit beam 3 from its front surface, with an intensity related to the amplitude of the driving current.

The laser diode also emits beam 18 from its back surface. Monitoring diode 15 and lead 16 are also provided, with the monitoring diode being coupled to lead 16 by means of filament 17. The monitoring diode provides a current on lead 16 having an amplitude related to the intensity of beam 18.

The package further includes cap 11 which is mechanically coupled to the flange 10 as shown. Output window 12, which is typically made of glass, is provided in the center of the topmost surface of cap 11, and the laser diode 1 is appropriately positioned within the interior of the package so that the beam 3 projects along an optical path through the window and exteriorly of the package.

In the preferred embodiment, the at least one lens is made integral with the output window of the package such as by means of the lamination process described in U.S. Pat. No. 4,756,972, Kloosterboer et al., which issued Jul. 12, 1988, is entitled "LAMINATED OPTICAL COMPONENT," and which is hereby fully incorporated by reference herein as though set forth in full, or by means of molding or grinding and polishing. Because of the high powers required and significant numeric aperture, the surface of the at least one lens is advantageously of aspheric profile with a diffraction limited optical surface quality, which the aforementioned lamination process is capable of providing. The at least one lens is advantageously made of plastic (acrylate) and is cylindrical, but it should be appreciated that other materials or shapes are possible. An example of a lens with a surface having an aspheric profile manufactured in accordance with the previously-discussed lamination process is disclosed in the referenced U.S. Pat. No. 4,756,972, or in U.S. Pat. No. 4,415,238, Braat et al., which issued Nov. 15, 1983, is entitled "SINGLE LENS HAVING ONE SPHERICAL AND ONE ASPHERICAL REFRACTIVE SURFACE," and which is hereby fully incorporated by reference herein as though set forth in full.

Figure 4:
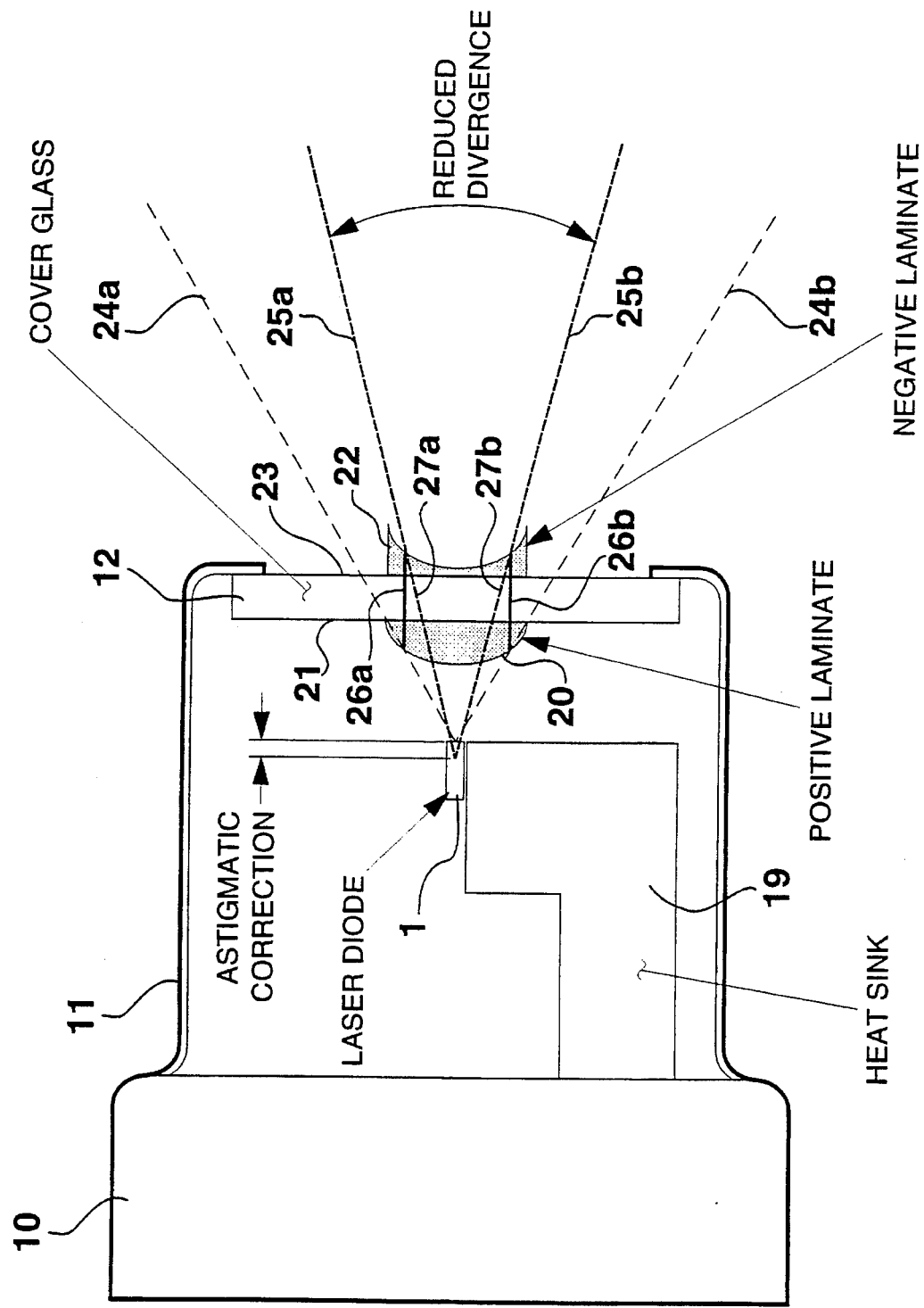
FIG. 4 is an illustration of an embodiment of the subject invention.

A side view of a laser diode package incorporating the subject invention is illustrated in FIG. 4, in which, compared to previous figures, like elements are referenced with like identifying numerals. As shown, a positive cylindrical lens 20 is laminated to the interior surface 21 of cover glass 12, using the process disclosed in U.S. Pat. No. 4,756,972, with the powered axis of the lens oriented with the perpendicular (high divergence) axis of the laser diode. Negative cylindrical lens 22 is likewise laminated to the exterior surface 23 of the cover glass using the same process, again with the powered axis of the lens oriented with the perpendicular (high divergence) axis of the diode. In this embodiment, the positive lens is adapted to approximately collimate that portion of the beam, identified with reference numerals 26a and 26b, which is oriented along the perpendicular axis of the laser diode. In addition, in this embodiment, the negative lens is adapted to substantially correct for astigmatism in the beam and produce a divergence for the perpendicular portion substantially similar to that of the parallel portion. The optical path of the perpendicular portion, in the absence of the two lenses, is identified with numerals 24a and 24b; the optical path of the perpendicular portion, when the two lenses are in place, is identified with numerals 25a and 25b. The divergence of the parallel portion of the beam, identified with reference numerals 27a and 27b, is substantially unaffected by the lenses in this embodiment. The overall effect is a laser diode with substantially no astigmatism and a reduced divergence in the perpendicular axis. The reduced divergence leads to an increase in optical efficiency at a reduced cost and size, compared to the prior art methods.

The aforementioned embodiment is particularly suitable for use in a laser bar code scanner. As is known, a laser bar code scanner typically comprises a frame, and an optical system at least partly affixed to the frame for providing a beam and scanning the beam over a bar code symbol in a predetermined pattern, characterized in that the beam is typically provided by a laser diode module which is included within the optical system. The scanner further comprises a collection system, for collecting reflected light from the bar code symbol, and providing a signal having an amplitude related to the intensity of the reflected light, and an electrical system for digitizing the signal, such that the width of and spacing between the pulses in the digitized signal correspond to the width of the black and white bars in the bar code symbol.

Such scanners typically utilize a circular aperature which results in at least partial equalization of the angles of divergence along the perpendicular and parallel axes of the laser diode, which method, as stated, is characterized by a significant loss of optical efficiency. By incorporating the subject invention into the output window of the laser diode used in such a scanner, the optical efficiency can be significantly increased without a significant increase in cost or size.

To illustrate this point, two sets of examples of the subject invention, which are particularly suitable for use in a laser bar code scanner, will now be presented. The first set of examples involve a lens configuration which only substantially corrects for the differing angles of divergence along the two axes, while the second set of examples involves a lens configuration which also substantially corrects for astigmatism. In both sets of examples, external lenses are also provided to collimate and focus the beam, but it should be appreciated that these functions could also be performed by the lenses of the subject invention. To establish a reference point for measuring the increase in optical efficiency, a baseline example utilizing aperaturing will first be presented for each set of examples.

FIRST SET OF EXAMPLES

FIRST BASELINE EXAMPLE

The first baseline example comprises a 10 mm focal length doublet or aspheric collimating lens and a focusing lens, which are spaced along the optical path of the beam exteriorly of the output window of the laser diode. The function of the collimating lens is to aperature and collimate the beam, and to correct for astigmatism, and the function of the focusing lens is to form a beam waist in the scan plane. The optical parameters associated with the origin (laser diode) in this example are assumed to be the following:

1. Wavelength=670 nm. nominal
2. Divergence along parallel axis=7.0 deg. FWHM.
3. Divergence along perpendicular axis=33.00 deg. FWHM.
4. Distance between origin and principal plane of collimating lens along parallel axis=10.060 mm.
5. Distance between origin and principal plane of collimating lens along perpendicular axis=10.025 mm.

The parameters associated with the entrance pupil, that is, the physical aperture as seen by the source, are as follows:

6. Distance between origin and entrance pupil along parallel axis=10.060 mm.
7. Distance between origin and entrance pupil along perpendicular axis=10.025 mm.
8. Size of entrance pupil—parallel axis=2.4 mm.
9. Size of entrance pupil—perpendicular axis=2.1 mm.
10. Entrance pupil geometry=rectangular.

The parameters associated with the focusing lens are as follows:

11. Distance between principal planes of collimating and focusing lenses=345 mm.
12. Focal length—parallel axis=420 mm.
13. Focal length—perpendicular axis=420 mm.

The parameters associated with the beam waist formed by this example are as follows:

14. Distance between beam waist and principal plane of focusing lens—parallel axis=418.337 mm.
15. Waist size—parallel axis=0.224 mm.
16. Distance between beam waist and principal plane of focusing lens—perpendicular axis=418.405 mm.
17. Waist size—perpendicular axis=0.221 mm.

The optical efficiency achieved in this example is 38.4%.

FIRST (HIGH EFFICIENCY) EXAMPLE

The first example comprises a positive cylindrical lens laminated to the inner surface of the window, a negative cylindrical lens laminated to the outer surface of the window, a standard off-the-shelf 10 mm doublet or aspheric collimating lens, and a focusing lens. The function of the collimating lens is to collimate the beam, and the function of the focusing lens is to form a beam waist in the scan plane.

The parameters associated with the origin in this example are assumed to be identical to those in the first baseline example, except that—consistent with the assumption that this example is not designed to correct for astigmatism—there is assumed to be no astigmatism in the source. Hence, the distance from the origin to the principal plane of the positive cylindrical lens is assumed to be the same, 1.0 mm. along both axes.

The parameters associated with the entrance pupil in this example are as follows:

1. Distance between origin and entrance pupil—parallel axis=10.025 mm.
2. Distance between origin and entrance pupil—perpendicular axis=10.025 mm.
3. Size of entrance pupil—parallel axis=2.4 mm.
4. Size of entrance pupil—perpendicular axis=3.850 mm.
5. Geometry of entrance pupil=rectangular.

The parameters associated with the positive cylindrical laminate are as follows:

6. Focal length—parallel axis=infinite (plano-surface)
7. Focal length—perpendicular axis=0.750 mm.

The parameters associated with the negative cylindrical laminate are as follows:

8. Distance between principal planes of positive and negative cylindrical laminates=0.5 mm.
9. Focal length—parallel axis=infinite (plano-surface)
10. Focal length—perpendicular axis=−0.938 mm.

The parameters associated with the collimating lens are as follows:

11. Distance between principal planes of negative cylindrical laminate and collimating lens=8.525 mm.
12. Focal length—parallel axis=10.025 mm.
13. Focal length—perpendicular axis=10.025 mm.

The parameters associated with the focusing lens are identical to those associated with the focusing lens in the first baseline example.

The characteristics of the beam waist which is formed in this example are as follows:

14. Distance between beam waist and principal plane of focusing lens—parallel axis=418.33 mm.
15. Size of beam waist—parallel axis=0.224 mm.
16. Distance between beam waist and principal plane of focusing lens—perpendicular axis=417.205 mm.
17. Size of beam waist—perpendicular axis=0.219 mm.

The optical efficiency achieved by this system is 62.2%.

SECOND (MEDIUM EFFICIENCY) EXAMPLE

This system comprises the same or similar optical elements as the previous example, and, as with the previous example, is configured to correct for the differing degrees divergence along the two axes only insofar as it is assumed that the origin has no astigmatism.

The parameters associated with the origin in this example are identical to those in the previous example.

The parameters associated with the entrance pupil in this example are identical to those in the previous example except that the size of the entrance pupil in this example along the perpendicular axis is 3.2 mm.

The parameters associated with the positive cylindrical laminate are as follows:

1. Focal length—parallel axis=infinite (plano-surface)
2. Focal length—perpendicular axis=1.0 mm.

The parameters associated with the negative cylindrical laminate are as follows:

3. Distance between principal planes of positive and negative cylindrical laminates=0.5 mm.
4. Focal length—parallel axis=infinite (plano-surface)
5. Focal length—perpendicular axis=−1.5 mm.

The parameters associated with the collimating and focusing lenses are identical to those in the previous example.

The parameters associated with the beam waist in this example are as follows:

6. Distance between beam waist and principal plane of focusing lens—parallel axis=418.330 mm.
7. Size of beam waist—parallel axis=0.224 mm.
8. Distance between beam waist and principal plane of focusing lens—perpendicular axis=419.280 mm.
9. Size of beam waist—perpendicular axis=0.219 mm.

The optical efficiency achieved in this example is 54.2%.

The base prescription for the laminates in this example are illustrated in FIG. 5.

SECOND SET OF EXAMPLES

SECOND BASELINE EXAMPLE

This baseline example comprises the same or similar elements as the first baseline example. The parameters associated with the origin in this example are as follows:

1. Wavelength=670 nm nominal.
2. Divergence—parallel axis=7 deg. FWHM.

3. Divergence—perpendicular axis=30 deg. FWHM.
4. Distance to principal plane of collimating lens—parallel axis—10.040 mm.
5. Distance to principal plane of collimating lens—perpendicular axis—10.000 mm.
6. Astigmatism=40 microns nominal.

The parameters associated with the entrance pupil in this example are as follows:

7. Distance—parallel axis=10.000 mm.
8. Distance—perpendicular axis=10.000 mm.
9. Size—parallel axis=2.300 mm.
10. Size—perpendicular axis=2.100 mm.
11. Pupil geometry=rectangular.

The parameters associated with the collimating lens are as follows:

12. Focal length—parallel axis=10.000 mm.
13. Focal length—perpendicular axis=10.000 mm.

The parameters associated with the focusing lens are as follows:

14. Distance between principal planes of collimating and focusing lenses—345 mm.
15. Focal length—parallel axis—420 mm.
16. Focal length—perpendicular axis—420 mm.

The parameters associated with the resultant beam waist are as follows:

17. Distance between beam waist and principal plane of focusing lens—parallel axis—350.106 mm.
18. Size of beam waist—parallel axis—0.222 mm.
19. Distance between beam waist and principal plane of focusing lens—perpendicular axis—418.405 mm.
20. Size of beam waist—perpendicular axis—0.221 mm.

As can be seen, this baseline example provides no astigmatic correction resulting in a residual astigmatism of nearly 70 mm in the scan plane. In addition, although this baseline example substantially equalizes divergence in the two axes, it does so with a resulting optical efficiency of only 38.2%.

THIRD (HIGH EFFICIENCY) EXAMPLE

This example comprises the same or similar four optical elements as the first and second examples.

The parameters associated with the origin in this example are identical to those in the second baseline example, except that the distances from the source to the positive cylindrical laminate are as follows:

1. Distance between origin and principal plane of positive cylindrical laminate—parallel axis=1.040 mm.
2. Distance between origin and principal plane of positive cylindrical laminate—perpendicular axis=1.000 mm.

The parameters associated with the entrance pupil in this example are identical to those in the second baseline example except the size of the entrance pupil has changed as follows:

3. Size of entrance pupil—parallel axis=2.4 mm.
4. Size of entrance pupil—perpendicular axis=3.7 mm.

The parameters associated with the positive cylindrical laminate are as follows:

5. Focal length—parallel axis=infinite (plano-surface)
6. Focal length—perpendicular axis=0.750 mm.

The parameters associated with the negative cylindrical laminate are as follows:

7. Distance between principal planes of positive and negative cylindrical laminates=0.450 mm.
8. Focal length—parallel axis=infinite (plano-surface)
9. Focal length—perpendicular axis=−0.941 mm.

The parameters associated with the collimating lens are identical to those associated with the collimating lens in the second baseline example, except that the distance between the principal planes of the negative cylindrical laminate and the collimating lens is 8.510 mm.

The parameters associated with the focusing lens are identical to those associated with the focusing lens in the second baseline example.

The parameters associated with the beam waist are as follows:

12. Distance between beam waist and principal plane of focusing lens—parallel axis=418.376 mm.
13. Size of beam waist—parallel axis=0.222 mm.
14. Distance between beam waist and principal plane of focusing lens=417.028 mm.
15. Size of beam waist—perpendicular axis=0.222 mm.

As can be seen, this example substantially corrects for astigmatism, with residual astigmatism in the scan plane of no more than 1.3 mm. In addition, the system corrects for the differing degrees of divergence along the two axes with a resulting optical efficiency of 60.4%.

The base prescription for the laminates in this example, using the same conventions listed for the prescription in the second example, are illustrated in FIG. 6.

FOURTH (MEDIUM EFFICIENCY) EXAMPLE

This system again comprises the same or similar four optical elements as the previous example, and is also configured to correct for astigmatism and for the differing degrees of divergence along the parallel and perpendicular axes.

The parameters associated with the origin this example are identical to those in the previous example.

The parameters associated with the entrance pupil in this example are identical to those in the previous example, except that the size of the entrance pupil in this example is as follows:

1. Size—parallel axis=2.4 mm.
2. Size—perpendicular axis=3.160 mm.

The parameters associated with the positive cylindrical laminate are as follows:

3. Focal length—parallel axis=infinite (plano-surface)
4. Focal length—perpendicular axis=1.0 mm.

The parameters associated with the negative cylindrical laminate are as follows:

5. Distance between principal planes of positive and negative laminates=0.450 mm.
6. Focal length—parallel axis=infinite (plano-surface)
7. Focal length—perpendicular axis=−1.491 mm.

The parameters associated with the collimating and focusing lenses in this example are identical to those in the previous example.

The parameters associated with the beam waist in this example are as follows:

8. Distance between principal plane of focusing lens and beam waist—parallel axis=418.376 mm.
9. Size of beam waist—parallel axis=0.222 mm.
10. Distance between principal plane of focusing lens and beam waist—perpendicular axis=417.459 mm.
11. Size of beam waist—perpendicular axis=0.222 mm.

As can be seen, this example, as configured, substantially corrects for astigmatism, with residual astigmatism in the scan plane of no more than 0.8 mm. In addition, the system substantially corrects for the differing degrees of divergence in the two axes with an optical efficiency of 53.6%.

The base prescription for the laminates in this example, using the conventions listed in the second example, are illustrated in FIG. 7.

SUMMARY OF EXAMPLES

A summary of the above examples is presented in the tables illustrated in FIGS. 8–10, with Table I (FIG. 8) providing a summary of the assumptions regarding divergence and astigmatism of the source for each example, with Table II (FIG. 9) providing a summary of the spacings between and focal lengths of the optical elements for each example, and with Table III (FIG. 10) providing a summary of the optical efficiency and beam waist parameters for each example.

It should be appreciated that other examples and embodiments are possible, such where the at least one lens (1) operates by increasing the angle of divergence along the parallel axis rather than decreasing the angle of divergence along the perpendicular axis; (2) is configured such that a negative cylindrical lens is situated on the innermost surface of the window and a positive cylindrical lens is situated on the outermost surface of the window; (3) substantially collimates and/or focuses the beam; (4) is configured such that only a single lens (positive or negative lens) is situated on one of the surfaces of the window; (5) is made integral with the window through processes other than lamination, such as molding, or grinding and polishing; or (6) is made of materials other than plastic such as the same material as the output window, i.e., glass.

It should also be apparent from the foregoing that, while particular forms of the invention have been illustrated and described, various modifications can be made without departing from the spirit and scope of the invention. Accordingly, it is not intended that the invention be limited, except as by the appended claims.

What is claimed is:

1. An optical system comprising:
    an enclosure including a window of solid transparent material;
    a source of a beam at least partially surrounded by the enclosure;
    means for directing the beam along an optical path through the window; and
    at least one separate lens element which is integrally mounted to and supported by the window.

2. The system of claim 1 wherein the source is a laser diode.

3. The system of claim 1 wherein the beam is an anomorphic diverging beam having differing angles of divergence along a plurality of axes, and the at least one lens is configured to at least partially equalize the angles of divergence along the plurality of axes.

4. The system of claim 1 wherein the beam is an astigmatic beam, and the at least one lens is configured to at least partly correct for the astigmatism of the beam.

5. The system of claim 1 wherein the at least one lens is configured to at least partially collimate the beam.

6. The system of claim 1 wherein the at least one lens is configured to at least partially focus the beam.

7. The system of claim 1 wherein the window is a glass window.

8. An optical system comprising:
    a source of a beam at least partially surrounded by the enclosure;
    means for directing the beam along an optical path through the window; and
    at least one lens integral with the window
    wherein the window has an inner surface and an outer surface, the beam is an anomorphic diverging beam having differing angles of divergence along a plurality of axes, and the at least one lens comprises:
        a positive cylindrical lens laminated to the inner surface of the window and having a powered axis oriented with a first of said plurality of axes; and
        a negative cylindrical lens laminated to the outer surface of the window and having a powered axis oriented with said first axis.

9. The system of claim 1 wherein the at least one lens is aspheric.

10. The system of claim 1 wherein the at least one lens is cylindrical.

11. The system of claim 1 wherein the at least one lens is plastic.

12. The system of claim 8 wherein the positive cylindrical lens is adapted to substantially collimate the beam along a second of said plurality of axes other than said first axis.

13. The system of claim 12 wherein the beam is otherwise astigmatic, and the negative cylindrical lens is adapted to at least partly correct for the astigmatism of the beam and produce an angle of divergence for the beam along a second of said plurality of axes other than said first axis which is substantially equal to that along said first axis.

14. The system of claim 1 wherein the beam has differing angles of divergence along a plurality of axes, and the at least one lens is configured to decrease the angle of divergence along one of said plurality of axes relative to the angle of divergence of the other of said plurality of said axes.

15. The system of claim 1 wherein the beam has differing angles of divergence along a plurality of axes, and the at least one lens is configured to increase the angle of divergence along one of said plurality of axes relative to the angle of divergence of the other of said plurality of said axes.

16. A laser diode assembly comprising:
    a laser diode package including an outer enclosure window of solid transparent material;
    a laser diode at least partially surrounded by the package and producing a beam;
    means for directing the beam along an optical path through the window, wherein the beam, after passing through the window, otherwise has differing angles of divergence along parallel and perpendicular axes; and
    at least one separate lens element which is integrally mounted to and supported by the window, and adapted to at least partially equalize the angles of divergence along the perpendicular and parallel axes.

17. The assembly of claim 16 wherein said at least one lens is adapted to decrease the angle of divergence along the perpendicular axis relative to the angle of divergence along the parallel axis.

18. The assembly of claim 16 wherein said at least one lens is adapted to increase the angle of divergence along the parallel axis relative to the angle of divergence along the perpendicular axis.

19. A laser diode assembly comprising:
    a laser diode package including a window of solid transparent material;

a laser diode at least partially surrounded by the package and producing a beam;

means for directing the beam along an optical path through the window, wherein the beam otherwise has differing apparent sources spaced by a distance when measured along perpendicular and parallel axes; and at least one separate lens element integrally mounted to and supported by the window and which is configured to at least partly decrease the distance by which the apparent sources are spaced.

20. A laser diode assembly comprising:

a laser diode package including a window of solid transparent material;

a laser diode at least partially surrounded by the package and producing a beam;

means for directing the beam along an optical path through the window, wherein the beam, after passing through the window, is otherwise diverging; and at least one separate lens element mounted to and supported by the window and configured to at least partially collimate the beam.

21. A laser diode assembly comprising:

a laser diode package including a window of solid transparent material;

a laser diode at least partially surrounded by the package and producing a beam;

means for directing the beam along an optical path through the window, wherein the beam, after passing through the window, is otherwise not converging; and at least one separate lens element mounted to and supported by the window and configured to at least partially focus the beam.

22. A laser diode assembly comprising:

a laser diode package including a glass window having an inner surface and an outer surface;

a laser diode at least partially surrounded by the package and producing a beam;

means for directing the beam along an optical path through the window, wherein the beam, after passing through the window, otherwise has differing angles of divergence along perpendicular and parallel axes, and otherwise has an apparent source when measured along the perpendicular axis which is spaced by a distance from that when measured along the parallel axis;

a plastic, aspheric positive cylindrical lens laminated to the inner surface of the glass window, having a powered axis oriented with the perpendicular axis of the beam, and adapted to substantially collimate the beam along the perpendicular axis; and a plastic, aspheric negative cylindrical lens laminated to the outer surface of the glass window, having a powered axis oriented with the perpendicular axis of the beam, adapted to substantially eliminate the distance spacing the apparent sources of the beam when measured along the perpendicular and parallel axes, and adapted to produce an angle of divergence along the perpendicular axis substantially equal to that along the parallel axis.

23. A bar code scanner comprising:

a frame;

an optical system, at least partly affixed to the frame, for providing a beam, and scanning the beam in a predetermined pattern over a bar code symbol, the optical system including a laser diode package having a window of a solid transparent material, with a laser diode at least partially surrounded by the package and producing the beam, and with means for directing the beam along an optical path through the window, the optical system further including at least one separate lens element mounted to and supported by the window;

a collection system, at least partly affixed to the frame, for collecting light reflected from the bar code symbol, the collected light having an intensity, and producing a signal having an amplitude determined, at least in part, by the intensity of the collected light; and an electrical system operatively coupled to the collection system for digitizing the signal.

24. The scanner of claim 23 wherein the beam, after passing through the window, otherwise has differing angles of divergence along perpendicular and parallel axes, and the at least one lens is configured to at least partially equalize the angles of divergence.

25. The scanner of claim 23 wherein the laser diode has an apparent source when measured along the parallel axis which is otherwise spaced by a distance from that when measured along the perpendicular axis, and the at least one lens is configured to at least partially decrease the distance by which the apparent sources are spaced.

26. The scanner of claim 23 wherein the at least one lens is configured to substantially collimate the beam.

27. The scanner of claim 23 wherein the at least one lens is configured to focus the beam and form a beam waist in a scan plane.

28. The scanner of claim 23 wherein the optical system further comprises a collimating lens, not integral with the window, for substantially collimating the beam.

29. The scanner of claim 23 wherein the optical system further comprises a focusing lens, not integral with the window, for focusing the beam and forming a beam waist in a scan volume.

30. The system of claim 1 wherein the window is a solid glass cover closing off one end of the enclosure.

31. The system of claim 1 wherein the at least one lens element is laminated to a surface of the window.

32. The system of claim 1 wherein the window has an inner surface and an outer surface and the at least one lens element comprises:

a first lens element laminated to the inner surface of the window and a second lens element laminated to the outer surface of the window.

33. The assembly according to claim 16 wherein the at least one lens element is laminated to a surface of the window.

34. The assembly according to claim 16 wherein the window is a solid glass cover closing off one end of the package.

35. A laser diode assembly according to claim 21 wherein the at least one lens element is laminated to a surface of the window.

36. A laser diode assembly according to claim 21 wherein the window is a solid glass cover closing off one end of the package.

37. A bar code scanner according to claim 23 wherein the at least one lens element is laminated to the window.

38. A bar code scanner according to claim 23 wherein the window is a solid glass cover closing off one end of the package.

39. The system of claim 32 wherein one of the first and second lens elements is adapted to equalize divergence angle of a beam being passed therethrough and the other of the first and second lens elements is adapted to correct for astigmatism of the beam being passed therethrough.

40. A bar code scanner according to claim 23 wherein the window has an inner surface and an outer surface and the at least one separate lens element comprises:

a first lens element laminated to the inner surface of the window and a second lens element laminated to the outer surface of the window.

41. A bar code scanner according to claim 40 wherein one of the first and second lens elements is adapted to equalize divergence angle of a beam being passed therethrough and the other of the first and second lens elements is adapted to correct for astigmatism of the beam being passed therethrough.

* * * * *